United States Patent [19]

Toyama et al.

[11] Patent Number: 4,827,452
[45] Date of Patent: May 2, 1989

[54] SEMICONDUCTOR MEMORY INCLUDING A SELECTIVELY DISABLED REDUNANCY CIRCUIT

[75] Inventors: Tsuyoshi Toyama; Kenji Kohda; Toshihiro Koyama, all of Itama, Japan

[73] Assignee: Mitsubishi Denki Kabushiki Kaisha, Tokyo, Japan

[21] Appl. No.: 894,023

[22] Filed: Aug. 7, 1986

[30] Foreign Application Priority Data

Aug. 13, 1985 [JP] Japan .................................. 60-179644

[51] Int. Cl.$^4$ ...................... G11C 7/00; G11C 29/00
[52] U.S. Cl. ...................................... 365/200; 371/10
[58] Field of Search .................. 365/200, 96, 189, 230; 371/10

[56] References Cited

U.S. PATENT DOCUMENTS

| | | | |
|---|---|---|---|
| 4,441,170 | 4/1984 | Folmsbee et al. | 365/200 |
| 4,507,761 | 3/1985 | Graham | 365/189 |
| 4,538,245 | 8/1985 | Smarandoiu et al. | 365/200 |
| 4,556,975 | 12/1985 | Smith et al. | 365/200 |
| 4,667,288 | 5/1987 | Keeley et al. | 371/10 |
| 4,714,839 | 12/1987 | Chung | 365/200 |

OTHER PUBLICATIONS

Woods, "An E-PROM'S Integrity Starts with its Cell Structure", published in Electronics, Aug. 14, 1980, pp. 132-136.

Primary Examiner—Stuart N. Hecker
Assistant Examiner—Glenn A. Gossage
Attorney, Agent, or Firm—Lowe, Price, LeBlanc, Becker & Shur

[57] ABSTRACT

A semiconductor memory device comprises a main memory 101 and a spare memory 102. When a part of the memory cells of the main memory 101 are defective, these defective memory cells are replaced by memory cells in the spare memory 102. The space memory 102 is decoded by the decoder circuit 104. The decoder circuit 104 is capable of decoding the spare memory 102 using a signal of an instruction memory 107. The instruction memory 107 is selectively enabled or disabled by an instruction control circuit 108. Consequently, in a state in which the instruction memory 107 is disabled by the control circuit 108, a spare memory selection signal is not provided from the instruction memory 107 to the decoder circuit 104 and the semiconductor memory device normally decodes the main memory including defective memory cells. As a result, the addresses and the like of the defective memory cells can be determined.

8 Claims, 4 Drawing Sheets

SEMICONDUCTOR MEMORY INCLUDING A SELECTIVELY DISABLED REDUNANCY CIRCUIT

BACKGROUND OF THE INVENTION

1. Field of the Invention

The present invention generally relates to a semiconductor memory device such as a semiconductor memory with a large scale integration according to the recent trend. More particularly, the present invention relates to a semiconductor memory device provided with a so-called redundancy circuit for replacing a defective memory cell by a spare memory cell.

2. Description of the Prior Art

A conventional semiconductor memory device having a redundancy circuit comprises, as shown in FIG. 4, a memory 1, a spare memory 2, a relief address memory 6 as a circuit for storing defective addresses, a spare row or column instruction memory 7 as a circuit for storing spare rows or spare columns, and a spare row or column decoder 4 as a control circuit for enabling a spare memory cell and disabling a regular memory cell. When a defective memory cell exists in the memory 1, the above stated semiconductor memory device replaces the row or the column containing the defective memory cell by a spare row or column in the spare memory 2 so that a memory cell in good condition can be used instead. Thus, the operation efficiency can be considerably improved.

In the future, according to further development of fine patterning technology, a redundancy circuit will become a more indispensable technique for the purpose of reducing the manufacturing cost of a large-capacity memory. On such occasion, it is important to utilize information as to whether each memory chip uses a spare row or column. In addition, in order to obtain a high yield of manufacturing, it is necessary to feed back to the manufacturing process the information as to the cause by which a memory cell in the memory portion 1 is defective. Information as to defectiveness in bits due to a defective patterning of a contact opening, defectiveness in lines due to rupture or short circuit of the connection of aluminum or polysilicon or the like is very useful for establishing the optimum conditions in the manufacturing process. However, such a conventional redundancy circuit system involves disadvantages that once a regular memory portion has been replaced by a redundancy circuit portion, it can not be determined from the outside whether the redundancy circuit is in use or not, or a defective memory cell can not be identified even if the state of the redundancy circuit can be determined. Moreover, in order to fetch to the exterior the address of the defective memory cell relieved by the redundancy circuit, a special circuit is required to perform special reading operation.

SUMMARY OF THE INVENTION

The present invention has been accomplished, in view of the above described problems, so that defectiveness in a memory portion can be easily detected. Therefore, it is an object of the present invention to provide a semiconductor memory device having a redundancy circuit.

A semiconductor memory device in accordance with the present invention comprises a main memory and a spare memory and further comprises an instruction memory control portion for selectively providing a signal for enabling, or a signal for disabling an instruction memory which provides a spare memory selection signal indicating use of the spare memory.

According to the present invention, when the instruction memory control portion provides an enable signal, the instruction memory is enabled and if a defective memory cell exists in the main memory, it can be replaced by a memory cell in the spare memory. When the instruction memory control portion provides a disable signal, the instruction memory is disabled so that defectiveness in the memory cells of the main memory can be analyzed.

Thus, even after defectiveness in the main memory has been compensated by using the spare memory, the defective mode in the main memory in case where the spare memory is not used can be easily analyzed.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
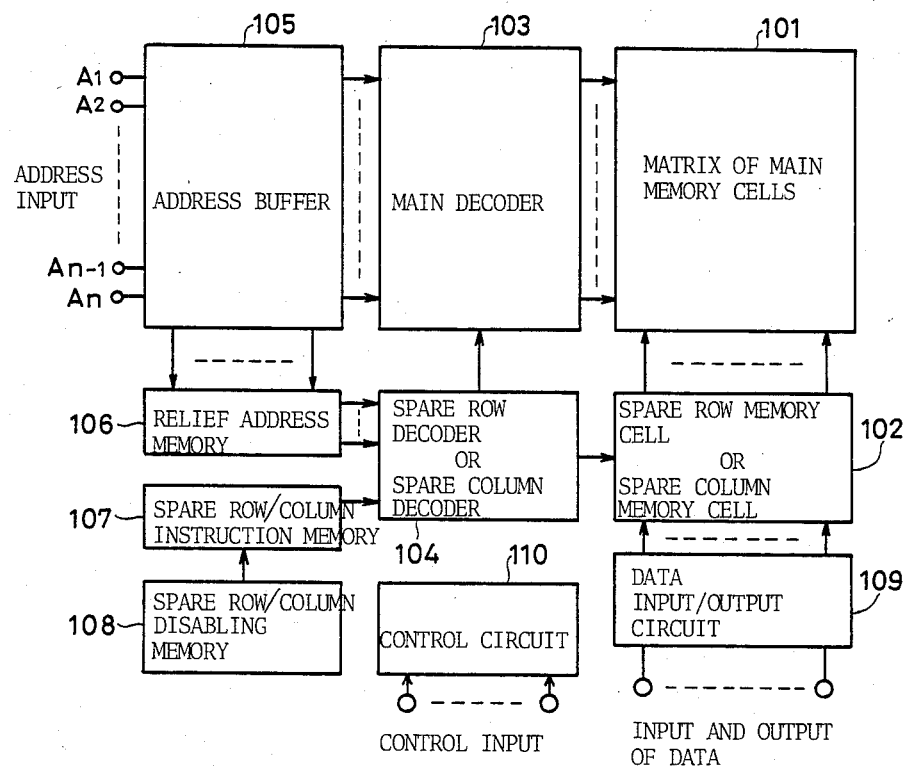
FIG. 1 is a circuit block diagram showing an embodiment of the present invention.
Figure 2:
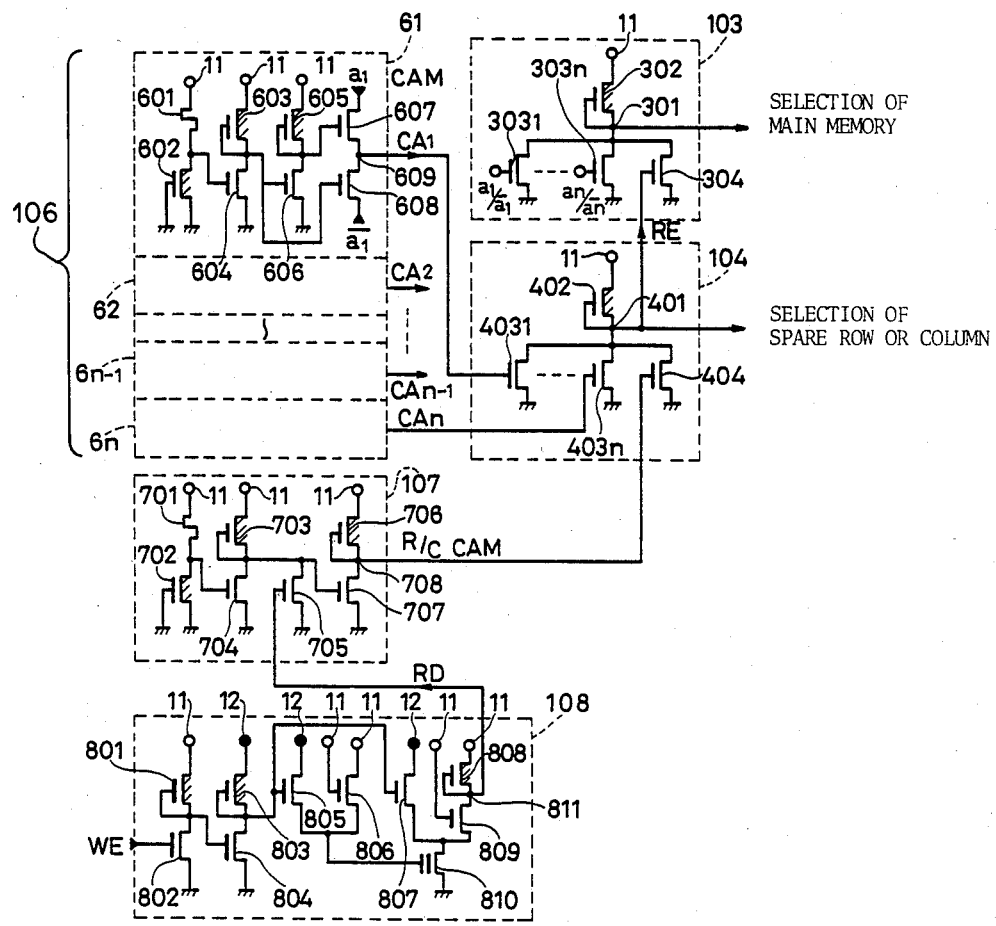
FIG. 2 is a circuit diagram showing an essential portion in FIG. 1.
Figure 3A:
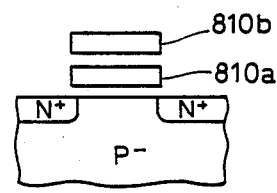
FIG. 3A is a view showing a structure of an EPROM cell of a FAMOS type.
Figure 3B:
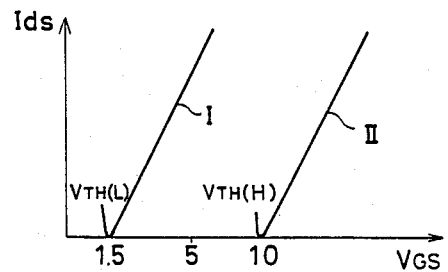
FIG. 3B is a diagram showing characteristics of the cell in FIG. 3A.
Figure 4:
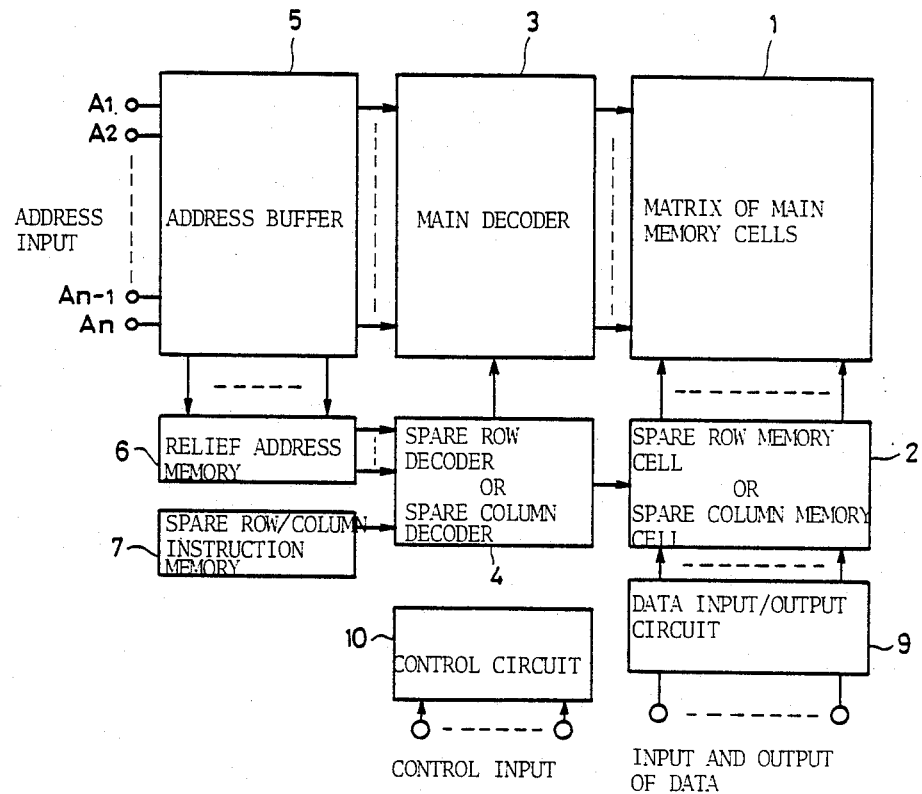
FIG. 4 is a circuit block diagram showing a conventional semiconductor memory device.

An embodiment of the present invention will be described with reference to the drawings. FIG. 1 is a circuit block diagram showing an embodiment of the present invention. Referring to FIG. 1, the reference numeral 101 indicates a main memory in which memory cells are arrayed in a matrix form; the reference numeral 102 indicates a spare memory in which spare memory cells are arrayed; and the reference numeral 103 indicates row decoders or column decoders for selecting a memory cell in the above stated main memory 101. As shown in FIG. 2, each decoder comprises: a load transistor 302 formed by a depletion type N-channel MOS transistor connected between a power source potential point 11 and an output node 301; address transistors 303-1 to 303-n formed by a number (n) of enhancement type N-channel MOS transistors connected in parallel between the output node 301 and the ground, address signals (a1, $\bar{a}$1) to (an, $\bar{a}$n) being applied from an address buffer 105 to the gates thereof; and a decoder selection transistor 304 formed by an enhancement type N-channel MOS transistor connected in parallel with the above stated address transistors. The number of the decoders corresponds to the number of the rows and the columns in the memory 101. The reference numeral 104 indicates a replacement control portion formed by spare row decoders and spare column decoders for selecting a spare memory cell in the above stated spare memory 102 and disabling the selection of the above stated memory 101. FIG. 2 shows one of the spare decoders in the replacement control portion. This spare decoder comprises: a load transistor 402 formed by a depletion type N-channel MOS transistor connected between a power source potential point 11 and an output node 401; address transistors 403-1 to 403-n formed by a number (n) of enhancement type N-channel MOS transistors connected in parallel between the output node 401 and the ground; and a spare decoder selection transistor 404 formed by an enhancement type N-channel MOS transistor connected in parallel with the above stated address transistors. The number of the spare decoders corresponds to the number of the spare rows and the spare columns. The output node 401 is connected with the gate of the decoder selection transistor 304 of each decoder 103 so that an RE signal is applied to the decoder selection transistor 304. The reference numeral 105 in FIG. 1 indicates an address buffer for providing address signals (a1, ā1) to (an, ān) to the above stated decoders 103 when address signals A1 to An are inputted; and the reference numeral 106 in FIG. 1 indicates a relief address memory for receiving the address signals (a1, ā1) to (an, ān) from the above stated address buffer. This relief address memory 106 is programmable to store the addresses of defective memory cells if there are any in the above stated main memory 101. FIG. 2 shows a concrete example of a circuit of the relief address memory corresponding to a row or a column. This relief address memory comprises n portions 61 to 6n. Each portion comprises: a polysilicon fuse 601 of low resistance and a depletion type N-channel MOS transistor 602 of high resistance connected in series between the power source potential point 11 and the ground; a depletion type N-channel MOS transistor 603 and an enhancement type N-channel MOS transistor 604 connected in series between the power source potential point 11 and the ground; a depletion type N-channel MOS transistor 605 and an enhancement type N-channel MOS transistor 606 connected in series between the power source potential point 11 and the ground; and enhancement type N-channel MOS transistors 607 and 608 connected in series between two address terminals. The gate of the transistor 604 is connected to a node between the fuse 601 and the transistor 602; the gates of the transistors 606 and 608 are connected to a node between the transistors 603 and 604; and the gate of the transistor 607 is connected to a node between the transistors 605 and 606. An address signal (a) is applied to an electrode of the transistor 607 and an address signal (ā) is applied to an electrode of the transistor 608. When the fuse 601 is not blown, a high potential is applied to the node between the fuse 601 and the transistor 602. Consequently, the transistor 604 is in a conducting state; the transistors 606 and 608 are in a non-conducting state; and the transistor 607 is in a conducting state. Thus, an output CA according to the address signal (a) appears at the output node 609. When the fuse 601 is blown by a laser beam or the like, a low potential (ground potential) is applied to the node between the fuse 601 and the transistor 602. Consequently, the transistor 604 is in a non-conducting state; the transistors 606 and 608 are in a conducting state; and the transistor 607 is in a non-conducting state. Thus, an output CA according to the address signal (ā) appears at the output node 609. The outputs (CA1 to CAn) are applied to the gates of the address transistors 403-1 to 403-n of the above stated spare decoder 104, respectively. The reference numeral 107 indicates a programmable spare row or column instruction memory for providing a spare memory selection signal (hereinafter referred to as a signal R/CCAM). As shown in FIG. 2, this memory 107 comprises: a polysilicon fuse 701 of low resistance and a depletion type N-channel MOS transistor 702 of high resistance connected in series between the power source potential point 11 and the ground; a depletion type N-channel MOS transistor 703 and an enhancement type N-channel MOS transistor 704 connected in series between the power source potential point 11 and the ground; a disabling transistor 705 formed by an enhancement type n-channel MOS transistor connected in parallel with the transistor 704; and a depletion type N-channel MOS transistor 706 and an enhancement type N-channel MOS transistor 707 connected in series between the power source potential point 11 and the ground. The gate of the transistor 704 is connected to a node between the fuse 701 and the transistor 702; the gate of the transistor 707 is connected to a node between the transistors 703 and 704; and an output node 708 between the transistors 706 and 707 is connected to the gate of the spare decoder selection transistor 404 in the above stated control portion 104, so that the signal R/CCAM is applied to the gate of the transistor 404. When the disabling transistor 705 is in a conducting state, the gate potential of the transistor 707 is always the L level irrespective of whether the fuse 701 is blown or not. Consequently, the transistor 707 is in a non-conducting state and the H level appears at the output node 708. When the disabling transistor 705 is not in a conducting state and the fuse 701 is not blown, a high potential is applied to the node between the fuse 701 and the transistor 702 and accordingly the transistor 704 is in a conducting state and the transistor 707 is not conducted, the output node 708 being at the H level. When the fuse 701 is blown, a low potential is applied to the node between the fuse 701 and the transistor 702 and consequently the transistor 704 is not in a conducting state and the transistor 707 is in a conducting state, the output node 708 being at the L level. The reference numeral 108 indicates an instruction memory control portion which is a spare row or column disabling memory for selectively providing a signal for enabling or disabling the above stated instruction memory 107 (hereinafter referred to as a signal RD). This control portion 108 comprises, as shown in FIG. 2, a depletion type N-channel MOS transistor 801 and an enhancement type N-channel MOS transistor 802 connected in series between the power source potential point 11 and the ground; and a depletion type N-channel MOS transistor 803 and an enhancement type N-channel MOS transistor 804 connected in series between a writing power source potential point 12 and the ground, the gate of the transistor 804 being connected to a node between the transistors 801 and 802 and the writing power source potential point 12 being made at a potential (for example 12.5 V) higher than the potential (for example 5 V constantly) of the power source potential point 11 at the time of writing and made at the potential of the power source potential point 11 or the ground level at the time of other operation. The control portion 108 further comprises: an enhancement type N-channel MOS transistor 805, the gate thereof being connected to a node between the transistors 803 and 804 and one main electrode thereof being connected to the writing power source potential point 12; an enhancement type N-channel MOS transistor 806 connected between the power source potential point 11 and the other main electrode of the transistor 805, the gate of the transistor 806 being connected to the power source potential point 11; an enhancement type N-channel MOS transistor 807, one main electrode thereof being connected to the writing power source potential point 12 and the gate thereof being connected to a node between the transistors 803 and 804; a depletion type N-channel MOS transistor 808 and an enhancement type MOS transistor 809 connected in series between the other main electrode of the transistor 807 and the power source potential point 11, the gate of the transistor 809 being connected to the power source potential point 11; and a threshold voltage variable non-volatile memory 810 which is a FAMOS type PROM erasable by ultraviolet rays, connected between a node of the transistors 807 and 809 and the ground. This memory 810 includes a floating gate 810a and a control gate 810b as shown in FIG. 3A. This memory 810 has characteristics as shown by the line II in FIG. 3B when the control gate 810b is connected to the node of the transistors 805 and 806 and data is written in this memory. It has characteristics as shown by the line I in FIG. 3B when the data is erased. The gate of the transistor 802 receives a signal WE which is normally at the L level (for example the ground potential) and rises to the H level (for example 12 V) at the time of writing operation. The output node 811 connected between the transistors 808 and 809 is connected to the gate of the disabling transistor 705 of the above stated instruction memory 107. This instruction memory control portion 108 operates in the below described manner. Since the threshold voltage variable type non-volatile memory 810 is normally in the erased state, this memory 810 is conducted by the power source potential applied to the gate thereof through the transistor 806 and the signal RD of the L level appears at the output node 811. When data is written in the threshold voltage variable type non-volatile memory 810, this memory 810 is in the non-conducting state with the power source potential applied to its gate and the signal RD of the H level appears at the output node 811. In addition, when data is written in the threshold voltage variable type non-volatile memory 810, the writing power source potential point 12 is made at a high potential and the signal WE is made to have the H level. Then, the transistor 802 is in a conducting state; the transistor 804 is not in a conducting state; and the transistors 805 and 807 are in a conducting state. As a result, a high potential is applied from the writing power source potential point 12 to a main electrode of the memory 810 and the control gate thereof so that electric charge is stored in the floating gate. Thus, the threshold voltage $V_{TH}(H)$ becomes approximately 10 V as shown in FIG. 3B and by applying ultraviolet rays, the threshold voltage $V_{TH}(L)$ becomes approximately 1.5 V as shown in FIG. 3B.

The reference numerals 109 and 110 in FIG. 1 indicate a data input and output circuit and a control circuit of the well known type, respectively.

Now, operation of the semiconductor memory device thus constructed will be described. First of all, if there is no defective memory cell in the main memory 101, the fuse 601 in the relief address memory 106 and the fuse 701 in the instruction memory 107 are not blown and the threshold voltage variable type non-volatile memory 810 in the instruction memory control portion 108 is brought into the erased state. Consequently, since the signal R/CCAM from the instruction memory 107 is at the H level, the spare decoder selection transistor 404 of the replacement control portion 104 is in a conducting state and the output node 401 of the replacement control portion 104 is at the L level irrespective of the signal CA from the relief address memory 106 based on the address signal from the address buffer 105. Accordingly, the spare memory portion 102 is not selected and the decoder selection transistor 304 in the decoder 103 is not conducted. Then, the decoder 103 performs decoding operation based on the address signal from the address buffer 105 so that a memory cell in the memory portion 101 is selected.

Then, if it is determined by a memory tester that a defective memory cell exists in the memory 101, it is examined whether the defective memory cell is replaceable by the spare memory 102 and if it is replaceable, the most suitable allotment in the spare memory 102 is examined. These examination operations are made by a testing device not shown. When the address signal of the associated row or column having the defective memory cell of the memory 101 is received by the relief address memory 106, the fuses 601 of the relief address memory portions 6-1 to 6-n are selectively blown by a laser beam and the fuse 701 of the instruction memory 107 is blown by a laser beam so that all the output signals CA1 to CAn of the portions 6-1 to 6-n of the relief address memory 106 are at the L level. At this time, the threshold voltage variable type non-volatile memory 810 of the instruction memory control portion 108 is made to be in an erased state. Consequently, the signal R/CCAM from the instruction memory 107 falls to the L level so that the spare decoder selection transistor 404 of the replacement control portion 104 is brought into non-conducting state and the replacement control portion 104 is enabled. Thus, when the address signal of the associated row or column having the defective memory cell of the memory 101 is received by the relief address memory 106, all the output signals CA thereof fall to the L level and the H level appears at the output node 409 of the replacement control portion 104. Accordingly, the decoder selection transistor 304 of the decoder 103 is in a non-conducting state and the decoder 103 is disabled. As a result, the memory cells of the memory 101 are not selected and the spare memory 103 is selected so that the defective memory cell of the memory 101 is replaced by a memory cell of the spare memory 103. On the other hand, if address signals other than the address signal of the associated row or column having the defective memory cell of the memory 101 are inputted from the address buffer 105 to the relief address memory 106, at least one of the signals CA of the portions 6-1 to 6-n rises to the H level and the L level appears at the output node 409 of the replacement control portion 104. Accordingly, the spare memory 102 is not selected and the decoder selection transistor 304 of the decoder 103 is in a non-conducting state. As a result, the decoder 103 performs decoding operation according to the address signals from the address buffer 105 so that the memory cells of the memory 101 are selected.

In case where the semiconductor memory device is used for analysis of the memory defects, for example as to whether the spare memory 102 is used or not, or which address has a defective memory cell, the signal WE is changed to the H level and a high potential is applied to the writing power source potential point 12. Consequently, data is written in the threshold voltage variable type non-volatile memory 810 of the instruction memory control portion 108 and the RD signal from the instruction memory control portion 108 attains the H level. Accordingly, the instruction memory 107 is disabled and the R/CCAM signal rises to the H level. Thus, the spare decoder selection transistor 404 of the replacement control portion 104 is in a conducting state and the output node 401 of the replacement control portion 104 is at the L level. Consequently, the spare memory 102 is not selected and the decoder 103 performs decoding operation. In this state, defectiveness in the memory cells of the memory 101 can be examined by testing all the addresses of the memory 101. After the analysis of defectiveness, the data in the threshold voltage variable type non-volatile memory 810 of the instruction memory control portion 108 can be erased by applying ultraviolet rays thereto and thus the semiconductor memory device can be operated as a good device.

In the semiconductor memory device structured as described above, the instruction memory 107 can be selectively enabled or disabled by the instruction memory control portion 108 in an easy and simple manner and thus defectiveness in the memory 101 can be easily examined.

In addition, since the threshold voltage variable type non-volatile memory 810 is used in the instruction memory control portion 108, analysis of defectiveness can be made in the same manner as for normal reading operation without any further input after writing of data. Furthermore, as far as the data is not erased even if the power source is turned off, the above stated state for analysis can be established and consequently, various kinds of analyses of defectiveness can be made.

Although the programable elements of the relief address memory 106 and the instruction memory 107 in the above described embodiment are of the type using fuses formed by polysilicon links to be blown by laser beam, other types, for example, using polysilicon to be cut off in an electric circuit, or a non-erasable FAMOS type EPROM may be adopted.

As the threshold voltage variable type non-volatile memory 810 of the instruction memory control portion 108, an electrically reloadable MNOS device or an EEPROM device of a floating gate type utilizing the tunnel effect may be used.

As for the memory cells of the memory 101, memory devices such as EPROM, EEPROM, static RAM, or dynamic RAM may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device provided with a redundancy circuit, comprising:
   a main memory including memory cells arrayed in a matrix,
   a spare memory including spare memory cells for correcting defective memory cells, if any, in said main memory by replacing said defective memory cells by suitable ones of said spare memory cells,
   a programmable correction address memory for storing the addresses of defective memory cells if such defective memory cells exist in said main memory,
   an instruction memory for providing a selection signal of said spare memory,
   a replacement control circuit for responding to a received address signal from said correction address memory and to a received spare memory selection signal from said instruction memory so that selection of an address in said main memory is disabled and said address is selected in said spare memory, and
   an instruction memory control circuit including a repeatably programmable non-volatile memory means for providing a signal for selectively enabling and disabling said instruction memory thereby enabling and disabling said replacement control circuit for standard memory operations and for analysis of defects therein, respectively.

2. A semiconductor memory device provided with a redundancy circuit in accordance with claim 1, wherein said instruction memory is a programable memory.

3. A semiconductor memory device provided with a redundancy circuit in accordance with claim 1, wherein said non-volatile memory means has a variable threshold voltage and said instruction memory control circuit comprises means for disabling said instruction memory in response to a first value of said threshold voltage and for enabling said instruction memory in response to a second value of said threshold voltage.

4. A semiconductor memory device provided with a redundancy circuit in accordance with claim 3, wherein said non-volatile memory means comprises an electrically programmable, ultraviolet light erasable, memory element,
said instruction memory connected for receiving a signal of said instruction memory control circuit and being disabled when a predetermined signal is written in said programmable, erasable, non-volatile memory element of said instruction memory control circuit for establishing said first value of said threshold voltage.

5. A semiconductor memory device provided with a redundancy circuit in accordance with claim 4, wherein said instruction memory is disabled when said non-volatile memory means in said instruction memory control circuit has been programmed to have a high threshold voltage.

6. A semiconductor memory device provided with a redundancy circuit in accordance with claim 4, wherein said non-volatile memory means comprises an electrically programmable, ultraviolet light erasable, read only memory element for programmably disabling said instruction memory and for programmably returning said instruction memory to an enabled condition.

7. In a semiconductor memory device provided with a redundancy circuit, including
   a main memory including memory cells arrayed in a matrix,
   a spare memory including spare memory cells for correcting defective memory cells, if any, in said main memory by replacing said defective memory cells by suitable ones of said spare memory cells,
   a programmable correction address memory for storing the addresses of defective memory cells if such defective memory cells exist in said main memory,
   an instruction memory for providing a selection signal of said spare memory,
   a replacement control circuit for responding to a received address signal from said correction address memory and to a received spare memory selection signal from said instruction memory so that selection of an address in said main memory is disabled and said address is selected in said spare memory,
   the improvement comprising:

means for analyzing defects of the main memory and memory cells thereof, comprising:

instruction memory control means for providing a control signal for selectively disabling and enabling said instruction memory, means for inputting a signal to said instruction memory control means when defect analysis is to be carried out, said instruction memory control means including variable threshold voltage non-volatile memory means for storing a data value determined by said signal inputted thereto, and means for outputting said control signal for disabling said instruction memory as a function of said data value stored by said non-volatile memory means, thereby disabling said replacement control circuit when said defect analysis is to be carried out for accessing the memory cells of said main memory even when a defective cell is addressed to permit analysis of cell defects for each cell of said main memory.

8. A semiconductor memory device provided with a redundancy circuit in accordance with claim 7, wherein said non-volatile memory means comprises electrically programmable read only memory means, erasable by ultraviolet light, for programmably disabling said instruction memory and for programmably returning said instruction memory to an enabled condition in accordance with the data value stored by said non-volatile memory means.

* * * * *